(12) United States Patent
Yang

(10) Patent No.: US 7,300,805 B2
(45) Date of Patent: Nov. 27, 2007

(54) METHOD OF MANUFACTURING A FERROELECTRIC CAPACITOR

(75) Inventor: Young Ho Yang, Chungcheongbuk-Do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/125,916

(22) Filed: May 10, 2005

(65) Prior Publication Data

US 2006/0073615 A1    Apr. 6, 2006

(30) Foreign Application Priority Data

Oct. 1, 2004  (KR) .................. 10-2004-0078296

(51) Int. Cl.
*H01L 21/00*  (2006.01)
(52) U.S. Cl. ......................................... 438/3; 438/240
(58) Field of Classification Search .............. 438/3, 438/240
See application file for complete search history.

(56) References Cited

U.S. PATENT DOCUMENTS 5,043,049 A * 8/1991 Takenaka ............... 204/192.15
5,728,603 A * 3/1998 Emesh et al. .................. 438/3
6,555,428 B2 * 4/2003 Jung .......................... 438/239

FOREIGN PATENT DOCUMENTS

KR    100436054 B1    6/2004

* cited by examiner

*Primary Examiner*—Jack Chen
(74) *Attorney, Agent, or Firm*—Marshall, Gerstein & Borun LLP

(57) ABSTRACT

Provided is a method of manufacturing a capacitor in a semiconductor device, comprising the steps of: forming a first metal film of noble series for the bottom electrode; forming a ferroelectric film on the first metal film; conducting a first thermal process on the resultant structure where the ferroelectric film is formed; conducting an ion implantation process on the resultant structure passing through the first thermal process; conducting a second thermal process on the resultant structure passing through the ion implantation process; forming a second metal layer of noble series for the top electrode on the ferroelectric film in the resultant structure passing through the first thermal process; and conducting a third thermal process on the resultant structure.

18 Claims, 2 Drawing Sheets

METHOD OF MANUFACTURING A FERROELECTRIC CAPACITOR

BACKGROUND

1. Field of the Invention

The present invention relates to a method of manufacturing a semiconductor device and specifically, to a method of manufacturing a capacitor in a semiconductor device.

2. Discussion of Related Art

In manufacturing capacitor of a ferroelectric RAM (Fe-RAM), it is recent to use a technique that fabricates a capacitor formed of a metal film as the bottom electrode, a ferroelectric film, and a metal film as the top electrode (i.e., metal film—ferroelectric film—metal film). By using such a ferroelectric film for the capacitor, a voltage applied from the external induces bilateral polarization to store data.

The intensity of Di-poles by the polarization is represented in the values of Ps (switching charge) and Pns (non-switching charge), the values of which are determined by the crystallization degree and grain uniformity of the ferroelectric film.

Therefore, it is now required of techniques for enhancing data storage capacity of the capacitor film from regulating the crystallization degree and grain uniformity of the ferroelectric film to be uniform while manufacturing the capacitor constructed with the structure that is metal film of the bottom electrode—ferroelectric film—metal film of the top electrode.

SUMMARY OF THE INVENTION

The present invention is directed to solve the problem, providing a method of manufacturing a capacitor of a semiconductor device, which enhances data storage capacity of the capacitor film from regulating the crystallization degree and grain uniformity of the ferroelectric film to be uniform while manufacturing the capacitor constructed with the structure that is metal film of the bottom electrode—ferroelectric film—metal film of the top electrode.

An aspect the present invention is to provide a method of manufacturing a capacitor in a semiconductor device, comprising the steps of: forming a first metal film; forming a ferroelectric film on the first metal film; conducting a first thermal process on the resultant structure where the ferroelectric film is formed; conducting an ion implantation process on the resultant structure passing through the first thermal process; conducting a second thermal process on the resultant structure passing through the ion implantation process; forming a second metal layer on the ferroelectric film in the resultant structure passing through the second thermal process; and conducting a third thermal process on the resultant structure.

Preferably, the first metal layer is formed of one among Ru, Pt, ir, IrOx, Re, Rh, TiN, and a compound of them. The second metal layer is formed of one among Ru, Pt, ir, IrOx, Re, Rh, TiN, and a compound of them.

Preferably, the ferroelectric film is formed in the thickness of 50 through 2000 Å, using one among SBT, PZT, SBTN, BLT, doped SBT, doped PZT, doped SBTN, doped BLT, modified SBT, modified PZT, modified SBTN, and modified BLT.

Preferably, the first thermal process is an oxidation annealing process in temperature of 300 through 800° C. A source used by the ion implantation process is preferred to be a metal divisible by titanium (Ti) or tantalum (Ta).

Preferably, the second thermal process is an oxidation annealing process in temperature 300 through 1000° C.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
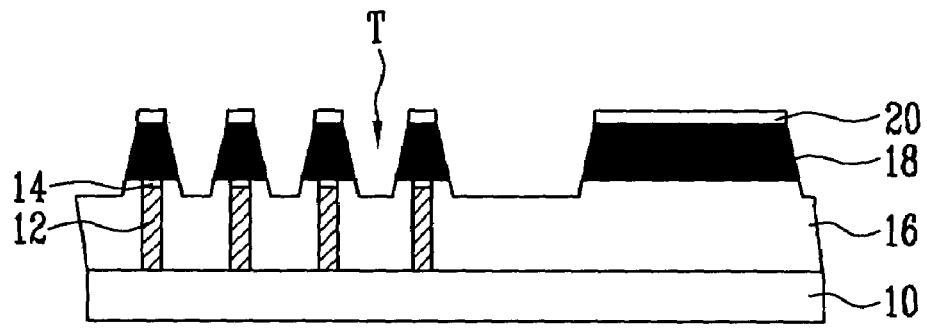
FIGS. 1 through 6 are sectional diagrams for explaining a method of manufacturing a capacitor in a semiconductor device in accordance with a preferred embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity and like numerals refer to like elements throughout the specification. It will also be understood that when a layer is referred to as being "on" another layer or substrate, it can be directly on the other layer or substrate, or intervening layers may also be present.

FIGS. 1 through 6 are sectional diagrams for explaining a method of manufacturing a capacitor in a semiconductor device in accordance with a preferred embodiment of the present invention.

Referring to FIG. 1, an interlevel insulation film 16 is deposited on the entire surface of a semiconductor substrate 10. And, after forming a storage plug node hole at a predetermined region of the interlevel insulation film 16 by conducting a photolithography process and an etching process, a metal is formed only in the storage plug node hole to form a storage plug node 12. After then, on the storage plug node 12, an oxidation protecting film 14 is formed to prevent the storage node from being oxidized during a high temperature thermal process in the atmosphere of $O_2$. Then, a glue layer (not shown) is formed on the resultant structure where the storage plug node 12 and the oxidation protecting film 14 are formed. The glue layer is made of one among HfxOy, $Al_2O_3$, Ti, TiO, and TiAlN.

Continuously, a first metal layer such as noble metal is formed on the entire surface of the resultant structure where the glue layer is formed. A patterned hard mask 20 is formed to define the bottom electrode at a predetermined region of the first metal layer. And then, the first metal layer and the interlevel insulation film 16 by a predetermined depth are etched away with the hard mask 20 as an etching mask, thereby forming a trench T to define a field isolation region as well as the bottom electrode 18.

The first metal layer, i.e., the bottom electrode 18, is made of one among Ru, Pt, ir, IrOx, Re, Rh, TiN, and a compound of them. The first metal layer 18 is formed by means of chemical vapor deposition (CVD), physical vapor deposition (PVD), or atomic layer deposition (ALD).

Figure 2:
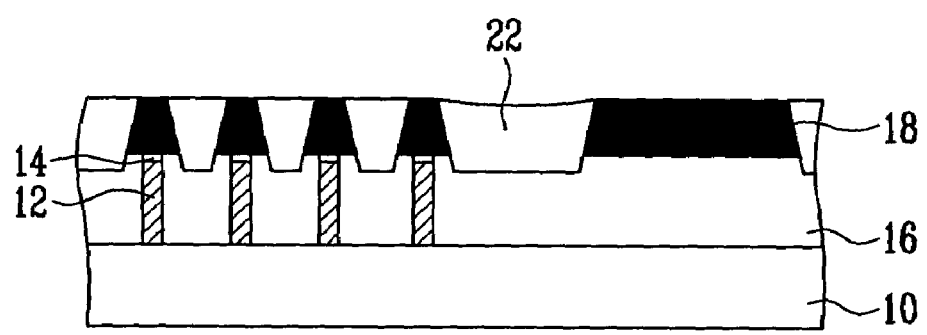

After forming the trench T, referring to FIG. 2, an insulation film is deposited to fill up the trench T and a planarization process such as chemical and mechanical polishing (CMP) is carried out until the hard mask 20 is disclosed, resulting in a field isolation film 22. The insulation film forming the field isolation film 22 is formed by means of low pressure CVD (LPCVD), plasma enhanced CVD (PECVD), high density plasma CVD (HDP-CVD), or spin coating method.

Figure 3:
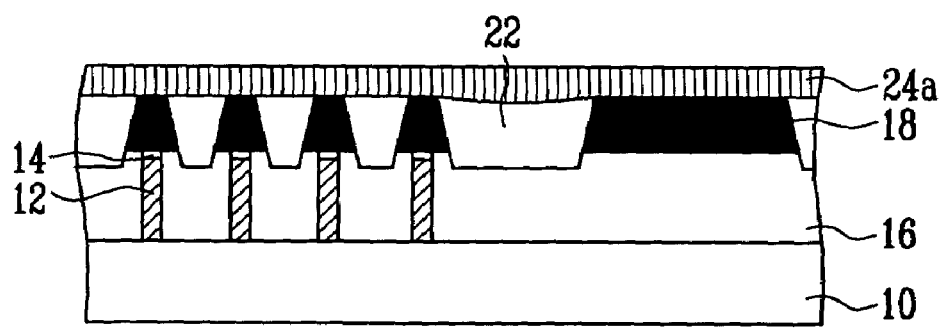

Referring to FIG. 3, a ferroelectric film 24a is formed on the entire surface of the resultant structure including the bottom electrode 18 and the field isolation film 22.

The ferroelectric film 24a is formed in the thickness of 50 through 2000 Å, using one among $SrBi_2TaO_2$ (hereinafter, referred to as SBT), $Bi(or\ La)_4Ti_3O_{12}$ (hereinafter, BLT), $Pb(or\ Zr)TiO_3$ (hereinafter, PZT), SBTN, modified SBT of which composition is different from the SBT, modified BLT of which composition is different from the BLT, modified PZT of which composition is different from the PZT, modified SBTN of which composition is different from the SBTN, doped SBT, doped PZT, doped SBTN, and doped BLT.

Next, a first thermal process is conducted on the resultant structure where the ferroelectric film 24a is formed. The first thermal process means an oxidation annealing step being carried out in temperature of 300 through 800° C. in order to generate crystallizing atoms in an amorphous ferro-layer for the purpose of resulting in crystallization of the ferroelectric film. The oxidation annealing step as the first thermal process enables a primitive crystallizing atom to be created and thereby makes crystallizing grains be grown on basis of the primitive crystallizing atom, in order to crystallize the ferroelectric film, in which oxygen atoms affects the crystallizing architecture of the ferro-layer. The first thermal process may also evaporate organic ingredient.

Figure 4:
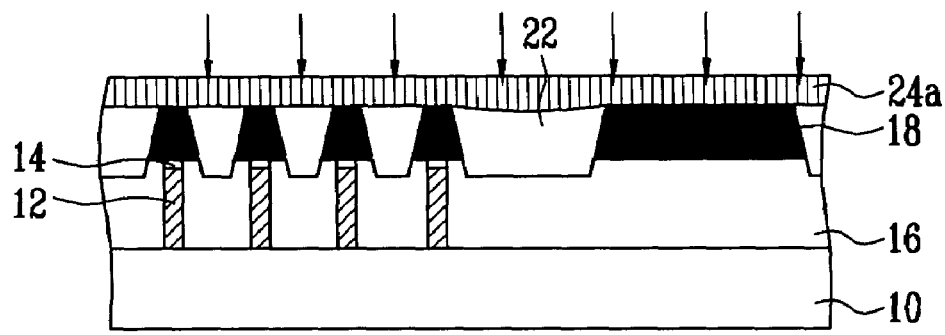

Referring to FIG. 4, an ion implantation process is carried out to the entire surface of the overall structure passing through the first thermal process. The ion implantation process is conducted to contract irregularly grown crystallizing atoms and enlarged crystallizing grains in size. After the ion implantation, a composition ratio becomes changed due to diffusion of elements of the ferroelectric material occurring while generating the crystallizing grains in the ferroelectric film. Therefore, it is able to reconstruct elements left out of the crystallizing structure during the thermal process, and to destruct the organization of the large crystallizing grains by physically accelerated ions.

The ion implantation process uses a kind of metal divisible by titanium (Ti) or tantalum (Ta), such as $TiCl_3$ or $Ta(OC_2H_5)_5$, as an ion source.

Figure 5:
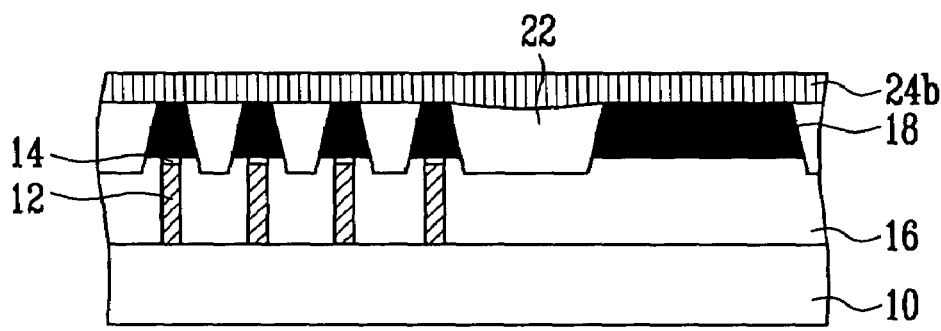

Referring to FIG. 5, a second thermal process is conducted on the resultant structure passing through the ion implantation process, forming a crystallized ferroelectric film 24b. The second thermal process means an oxidation annealing step being carried out in temperature of 300 through 1000° C. in order to re-crystallize the ferroelectric film after the ion implantation. The second thermal process is provided to enable regeneration of crystallizing grains, because the structure of crystallization is broken by the former processes, and also provided to render the injected ions to be diffused and conditioned to ferroelectric characteristic. After completing the second thermal process, the defects in the crystalline structure are cured by substitution with oxygen vacancies.

Figure 6:
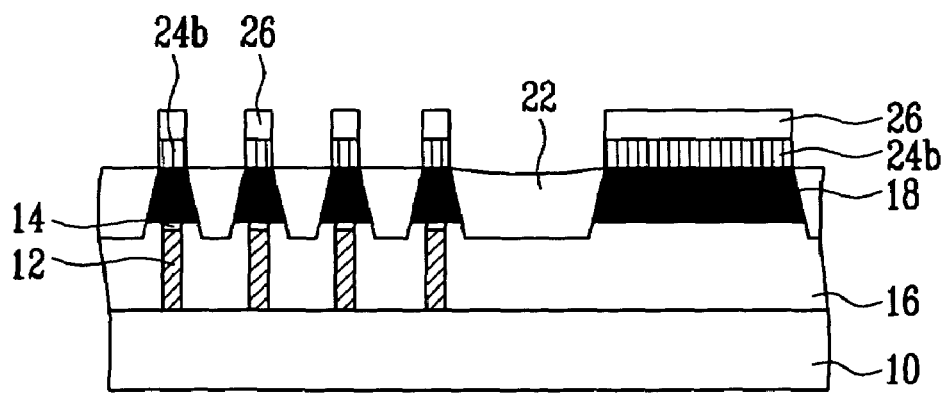

Referring FIG. 6, a second metal layer of noble series is deposited on the entire surface of the resultant structure where the crystallized ferroelectric film 24b is formed by the second thermal process. A patterned hard mask (not shown) is formed to define the top electrode at a predetermined region of the second metal layer of noble series. And then, the second metal layer and the crystallized ferroelectric film 24b are etched away with the hard mask as an etching mask, forming a top electrode 26, and patterned and crystallized ferroelectric film 24b. And then, a thermal oxidation process is carried out further on the overall structure.

The second metal layer of noble series, i.e., the bottom electrode 18, is formed of one among Ru, Pt, ir, IrOx, Re, Rh, TiN, and a compound of them, by means of CVD, PVD, or ALD.

The ferroelectric film is treated by way of the first thermal process, the ion implantation process, and the second thermal process, which improves the degree of crystallization and the uniformity of grain sizes and thereby enhances the data storage capacity of the ferroelectric film.

As described above, the method of the present invention is effective in improving the data storage capacity of the capacitor by increasing the degree of crystallization and the uniformity of grain sizes, while manufacturing a capacitor formed of metal—ferroelectric film—metal, by treating the ferroelectric film by way of the first thermal process, the ion implantation process, and the second thermal process.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a ferroelectric capacitor comprising the steps of:
   forming a first metal layer;
   forming a ferroelectric film on the first metal layer;
   conducting a first annealing process at a first temperature in order to generate crystallizing atoms within the ferroelectric film;
   conducting an ion implantation process after conducting the first annealing process;
   conducting a second annealing process at a temperature higher than the first temperature after the ion implantation process;
   forming a second metal layer on the ferroelectric film; and
   conducting a third annealing process.

2. The method as set forth in claim 1, comprising forming the first metal layer of a member of the group consisting of Ru, Pt, Ir, $IrO_x$, Re, Rh, TiN, and compounds thereof.

3. The method as set forth in claim 1, comprising forming the second metal layer of a member of the group consisting of Ru, Pt, Ir, $IrO_x$, Re, Rh, TiN, and compounds thereof.

4. The method as set forth in claim 1, comprising forming the ferroelectric film in a thickness of 50 Å through 2000 Å, using a member of the group consisting of SBT, SBTN, BLT, doped SBT, doped SBTN, doped BLT, modified SBT, modified SBTN, and modified BLT.

5. The method as set forth in claim 1, comprising conducting the first annealing process at a temperature in the range of 300° C. through 600° C.

6. The method as set forth in claim 1, wherein a source used by the ion implantation process is a metal divisible by titanium (Ti) or tantalum (Ta).

7. The method as set forth in claim 1, comprising conducting the second annealing process at a temperature in the range of 650° C. to 1000° C.

8. The method as set forth in claim 7, comprising conducting the first annealing process at a temperature in the range of 300° C. to 600° C.

9. The method as set forth in claim 1, comprising forming the ferroelectric film is of PZT, doped PZT, or modified PZT.

10. The method as set forth in claim 1, further comprising forming an isolation film on the first metal film and the ferroelectric film.

11. A method of manufacturing a ferroelectric capacitor comprising the steps of:
forming a first metal layer;
forming a patterned hard mask layer on the first metal layer;
etching the first metal layer using the patterned hard mask layer as an etching mask, thereby forming trenches and bottom electrodes;
forming an isolation film between the bottom electrodes;
forming a ferroelectric film on the bottom electrodes and the isolation film;
performing a first annealing process at a first temperature in order to generate crystallizing atoms within the ferroelectric film;
conducting an ion implantation process after conducting the first annealing process;
conducting a second annealing process at a temperature higher than the first temperature after the ion implantation process;
forming a second metal layer on the ferroelectric film;
patterning the second metal layer and the ferroelectric film, thereby forming top electrodes; and
conducting a third annealing process.

12. The method as set forth in claim 11, comprising forming the first metal layer of a member of the group consisting of Ru, Pt, ir, $IrO_x$, Re, Rh, TiN, and compounds thereof.

13. The method as set forth in claim 11, comprising forming the second metal layer of a member of the group consisting of Ru, Pt, ir, $IrO_x$, Re, Rh, TiN, and compounds thereof.

14. The method as set forth in claim 11, comprising forming the ferroelectric film in a thickness of 50 Å through 2000 Å, using a member of the group consisting of SBT, SBTN, BLT, doped SBT, doped SBTN, doped BLT, modified SBT, modified SBTN, and modified BLT.

15. The method as set forth in claim 11, comprising conducting the first annealing process at a temperature in the range of 300° C. to 600° C.

16. The method as set forth in claim 11, wherein a source used by the ion implantation process is a metal divisible by titanium (Ti) or tantalum (Ta).

17. The method as set forth in claim 11, comprising conducting the second annealing process at a temperature in the range of 650° C. to 1000° C.

18. The method as set forth in claim 17, comprising conducting the first annealing process at a temperature in the range of 300° C. to 600° C.

* * * * *